(12) United States Patent
Mueller

(10) Patent No.: US 11,988,697 B2
(45) Date of Patent: May 21, 2024

(54) DEVICE FOR MEASURING A CURRENT THROUGH A CHOKE AND METHOD FOR OPERATING A DEVICE FOR MEASURING A CURRENT THROUGH A CHOKE

(71) Applicant: Robert Bosch GmbH, Stuttgart (DE)

(72) Inventor: Stephan Mueller, Marbach am Neckar (DE)

(73) Assignee: Robert Bosch GmbH, Stuttgart (DE)

( * ) Notice: Subject to any disclaimer, the term of this patent is extended or adjusted under 35 U.S.C. 154(b) by 193 days.

(21) Appl. No.: 17/784,694

(22) PCT Filed: Oct. 27, 2020

(86) PCT No.: PCT/EP2020/080123
§ 371 (c)(1),
(2) Date: Jun. 13, 2022

(87) PCT Pub. No.: WO2021/115675
PCT Pub. Date: Jun. 17, 2021

(65) Prior Publication Data
US 2023/0003776 A1     Jan. 5, 2023

(30) Foreign Application Priority Data
Dec. 12, 2019 (DE) ..................... 10 2019 219 488.5

(51) Int. Cl.
*G01R 19/32*      (2006.01)
*H02M 3/337*     (2006.01)

(52) U.S. Cl.
CPC .......... *G01R 19/32* (2013.01); *H02M 3/3376* (2013.01)

(58) Field of Classification Search
CPC .. G01R 19/32; H02M 3/3376; H02M 1/0009; H02M 3/33584
See application file for complete search history.

(56) References Cited

U.S. PATENT DOCUMENTS

2013/0063107 A1* 3/2013 Nishida ............... H02M 3/1588
307/43
2013/0088211 A1* 4/2013 Radtke ................. H02M 3/005
323/282
(Continued)

FOREIGN PATENT DOCUMENTS

| CN | 104638885 A | 5/2015 |
| JP | 2010011294 A | 1/2010 |
| KR | 20110012116 A | 2/2011 |

OTHER PUBLICATIONS

Translation of International Search Report for Application No. PCT/EP2020/080123 dated Feb. 1, 2021 (3 pages).

(Continued)

*Primary Examiner* — Alvaro E Fortich
(74) *Attorney, Agent, or Firm* — Michael Best & Friedrich LLP

(57) ABSTRACT

The invention relates to a device (200) for measuring a current through a choke (130) of a voltage converter (100) comprising an integrator circuit (140), an amplifier circuit and an NTC resistor (160). The amplifier circuit comprises an inverting and a non-inverting amplifier input connection (152, 154) and an amplifier output connection (156). The non-inverting amplifier input connection (154) is supplied with an amplifier input signal according to an integrator output signal. A voltage signal characterising the current through the choke (130) is applied at the amplifier output connection (156) of the amplifier circuit. The NTC resistor (160) is arranged in the feedback path of the amplifier circuit between the inverting amplifier input connection (152) and the amplifier output connection (156).

12 Claims, 6 Drawing Sheets

(56) References Cited

U.S. PATENT DOCUMENTS

| | | | |
|---|---|---|---|
| 2015/0083708 A1* | 3/2015 | Xiang | G01K 15/005 |
| | | | 219/494 |
| 2016/0065061 A1* | 3/2016 | Tsyrganovich | H02M 3/156 |
| | | | 323/312 |
| 2018/0340964 A1 | 11/2018 | Ranucci | |
| 2019/0238054 A1* | 8/2019 | Flaibani | H02M 3/158 |

OTHER PUBLICATIONS

Tsang et al., "Temperature compensated high efficiency inductor current sensor", Sensors and Actuators A, 2009, vol. 154, pp. 16-22.
Levigion, "Temperatur-Kompensation elektrischer Groessen", Technisches Messen ATM, vol. z119-8, No. 452, 1973, pp. 177-180.

\* cited by examiner

DEVICE FOR MEASURING A CURRENT THROUGH A CHOKE AND METHOD FOR OPERATING A DEVICE FOR MEASURING A CURRENT THROUGH A CHOKE

BACKGROUND OF THE INVENTION

The invention relates to a device for measuring a current through a choke and a method for operating a device for measuring a current through a choke. The invention also relates to a drive train having a device, a vehicle having a drive train, and to a computer program and a machine-readable storage medium.

Methods for current measurement are known in which a current in a power-electronic system, for example in a DC-voltage converter, can be measured via the voltage drop of a smoothing choke, for example. No separate shunt resistor is required for this. Such methods are known as "DCR current sensing", where the abbreviation "DCR" stands for "DC resistance" of the choke. Here, the current through the choke is measured indirectly by detecting the voltage drop across the choke and continuously integrating it. The measured current is obtained by integrating the voltage. For this purpose, an integrator circuit is used, which is matched to the electrical properties of the choke, for example by means of an RC low-pass, for example a series circuit of a resistor and capacitor in parallel with the choke. Under very rapid current changes, the inductive component of the voltage drop across the choke dominates over the voltage drop across the copper resistance of the choke. For DC currents, on the other hand, no voltage is dropped across the inductance, so that the current can be measured directly via the ohmic copper resistance of the choke. The integrator circuit is dimensioned such that its time constant or its cutoff frequency is almost identical to the time constant or cutoff frequency of the choke. The time constant of the integrator circuit corresponds to the product of the ohmic resistance and capacitance of the integrator circuit (R*C). The time constant of the choke corresponds to the quotient of the inductance of the choke divided by the ohmic resistance of the choke (L/Rdc). Therefore, for identical time constants, the product of the ohmic resistance and capacitance of the integrator circuit corresponds to the quotient of the inductance of the choke divided by the ohmic resistance of the choke (R*C=L/Rdc). This ensures that the overall transfer function is constant over the entire frequency range. The transfer function of the choke is given by: Rdc+s*L, or that of the RC filter of the integrator circuit: 1/(1+s*R*C), with s=ω. Multiplying the two functions, the overall transfer function is obtained:

$$G(s) = R_{dc} * \frac{\left(1/s * \frac{L}{R_{dc}}\right)}{(1 + s*R*C)}$$

If both time constants are equal, then the frequency-dependent component is always 1 and thus the following applies: G(s)=Rdc.

The advantages of this measuring principle compared to other current sensors such as a shunt resistor are the lower unit costs, the smaller space requirements, and a loss-free current measurement. However, the measurement accuracy is limited because the copper resistance of the choke is subject to high production tolerances and is also highly temperature-dependent. Temperature compensation can be achieved by means of an NTC resistor connected in parallel with the capacitor of the integrator circuit. The temperature-dependent gain factor of the sensor circuit is varied in such a way that it counteracts the temperature coefficient of the copper resistance of the choke and thus almost completely compensates for the influence of temperature.

However, the circuit design above does not allow measurement of a current that is not only fluctuating but also changing its direction of flow, and thus flowing bi-directionally. The resulting negative voltage measurement signals cannot be processed without additional circuit complexity. In such cases, it is known to shift the zero point by means of an injected bias offset voltage in order to extend the measuring range for negative currents and thus always output positive voltage measurement signals. However, the temperature compensation using an NTC resistor changes the offset voltage depending on temperature, which means that the current value can no longer be correctly derived from the voltage measurement signal.

Therefore, there is a need for alternative measuring circuits.

SUMMARY OF THE INVENTION

A device is provided for measuring a current through a choke of a voltage converter having an integrator circuit, an amplifier circuit, and an NTC resistor. A load current flows through the choke of the voltage converter. The choke is connected on the output side to an output terminal of the voltage converter. The integrator circuit is arranged in parallel with the choke. The integrator circuit comprises a series circuit consisting of an integrator resistor and an integrator capacitor. The integrator capacitor is also connected to the output terminal of the voltage converter. A center tap is implemented between the integrator resistor and the integrator capacitor as an output of the integrator circuit. An integrator output signal is present at this output of the integrator circuit. The amplifier circuit comprises an inverting and a non-inverting amplifier input terminal and an amplifier output terminal. The non-inverting amplifier input terminal is supplied with an amplifier input signal depending on the integrator output signal. A voltage signal characterizing the current through the choke is present at the amplifier output terminal of the amplifier circuit. The NTC resistor is arranged in the feedback path of the amplifier circuit between the inverting amplifier input terminal and the amplifier output terminal.

A device is provided for measuring a preferably bidirectional current through a choke, which is preferably designed as a smoothing choke on the secondary side at the output of a voltage converter. The device comprises an integrator circuit and a preferably active amplifier circuit. An integrator output signal is present at the output of the integrator circuit. An amplifier input signal is fed to the non-inverting amplifier input terminal as a function of the integrator output signal, wherein for this purpose the output of the integrator circuit is preferably electrically connected to the non-inverting amplifier input terminal, preferably directly connected. The NTC resistor is arranged in the feedback path of the amplifier circuit between the inverting amplifier input terminal and the amplifier output terminal.

A device is advantageously provided, in which the NTC resistor is arranged independently of a possible offset voltage, thus allowing an undistorted measurement of bidirectional currents. Since the NTC resistor is decoupled from a potential zero-point offset generation, any adverse effect due to the NTC resistor is avoided. An extension of the measuring circuit used for DCR current measurement is provided for bi-directional currents without the use of a bipolar supply voltage and while maintaining the temperature compensation using an NTC resistor and active amplifier circuit.

In another embodiment of the invention, the amplifier circuit comprises an operational amplifier.

The amplifier circuit comprises an operational amplifier which preferably operates as a non-inverting operational amplifier. A means is advantageously created of providing an efficient amplifier circuit which enables an economical implementation of the device. An additional active amplifier circuit using operational amplifiers is preferably used, wherein the amplifier stage is also used to amplify the useful signal, in particular the integrator output signal, in order to achieve an improved resolution of the useful signal. The amplification of the useful signal is preferably applied if the copper resistance of the inductor coil is very low in relation to the measured current.

In another embodiment of the invention, the device comprises a reference voltage source with a positive source terminal and a negative source terminal. Using the reference voltage source, a first offset voltage is coupled in at the output of the integrator circuit. Preferably, the negative source terminal is connected to the output terminal of the voltage converter and the positive source terminal is connected to the output of the integrator circuit via a coupling resistor.

Using a reference voltage source, a first offset voltage is coupled in at the output of the integrator circuit. As a result, the potential of the integrator output signal is raised. This allows the circuit to be used even for currents flowing in the opposite direction. A device is advantageously provided that can be used to detect bi-directional currents.

Preferably, the zero point offset, the first offset voltage, at the output of the integrator circuit is generated by means of the reference voltage source which is coupled into the signal path, the integrator output signal, via the coupling resistor.

In another embodiment of the invention, a second offset voltage is coupled into the feedback path at the inverting amplifier input terminal of the amplifier circuit by means of the reference voltage source. Preferably, the negative source terminal is connected to the output terminal of the voltage converter and the positive source terminal is connected to the output terminal of the voltage converter via a voltage divider having a first, second and third voltage divider resistor. Furthermore, a tap between the second and third voltage divider resistors is preferably connected to the inverting amplifier input terminal.

By means of the reference voltage source, a second offset voltage is coupled in at the inverting amplifier input terminal of the amplifier circuit. Advantageously, this results in the possibility, preferably by dimensioning of the voltage divider resistors, that the second offset voltage at the inverting input of the operational amplifier will be set identical to the voltage at the non-inverting input, even if no current flows through the choke. The second offset voltage preferably remains the same even with increasing currents through the choke.

Preferably, the amplifier circuit or the operational amplifier operates as a non-inverting amplifier. If the NTC resistor changes with temperature, the linear gain factor of the circuit changes at the same time, because the NTC resistor changes the dividing factor in the feedback path. To ensure that a third offset voltage at the output of the amplifier circuit remains constant independently of temperature, the reference voltage source is also fed into the feedback path of the amplifier circuit. The voltage divider resistors, preferably three of them, form a voltage divider. By appropriate dimensioning of the resistors, the second offset voltage at the inverting input of the amplifier circuit will be set almost identical to the voltage at the non-inverting input. If the current to be measured through the choke increases from 0A to higher values, only the voltage increase due to the current change is amplified. Preferably, the first, second and third offset voltages remain the same if no current flows through the choke.

In another embodiment of the invention, in the feedback path of the amplifier circuit between the inverting amplifier input terminal and the amplifier output terminal, a series resistor is arranged in series with the NTC resistor and a parallel resistor is arranged in parallel with the series circuit consisting of series resistor and NTC resistor.

A resistor is arranged in series with the NTC resistor and a parallel resistor is arranged in parallel with the series circuit consisting of the serial and NTC resistors. These three resistors are arranged in the feedback path of the amplifier circuit between the inverting amplifier input terminal and the amplifier output terminal. A circuit arrangement for linearizing the NTC resistance over temperature is advantageous. Without this circuit arrangement, the resistor behaves nonlinearly with temperature.

Preferably, the resistor in series with the NTC resistor and a parallel resistor in parallel with the series circuit of the series and NTC resistors serves to linearize the NTC resistor with temperature, since the NTC resistor behaves non-linearly with temperature. The function of the series resistor is to prevent the total impedance consisting of the NTC resistor, the series resistor, and the parallel resistor from becoming too small at high temperatures. The function of the parallel resistor, on the other hand, is to prevent the total impedance of the NTC resistor, the series resistor, and the parallel resistor from becoming too highly resistive at low temperatures.

In another embodiment of the invention, a first filter capacitor is arranged in parallel with the NTC resistor.

Advantageously, a circuit arrangement is provided that adjusts the gain factor in a frequency-selective manner. The first filter capacitor, connected in parallel with the NTC resistor, short-circuits the NTC resistor at higher frequencies so that it is no longer active above a specified or specifiable cutoff frequency.

In another embodiment of the invention, a second filter capacitor is arranged in parallel with the first voltage divider resistor or the second voltage divider resistor.

Advantageously, a circuit arrangement is provided that adjusts the gain factor in a frequency-selective manner. The second filter capacitor, connected in parallel to the first or second voltage divider resistor, short-circuits the first or second voltage divider resistor at higher frequencies so that it is no longer active above a specified or specifiable cutoff frequency and only one of the two voltage divider resistors is now active. Therefore, the NTC resistor preferably only acts frequency-selectively at low frequencies below a specified or specifiable cutoff frequency, preferably the cutoff frequency of the choke, which is given by the quotient of its inductance and copper resistance.

Preferably, an amplifier circuit is provided which enables the measuring range for bi-directional currents and the temperature compensation by means of an NTC resistor at the same time, wherein the NTC resistor is not connected to the output of the integrator circuit but instead is arranged in the feedback path of the amplifier circuit.

Furthermore, the time constants of the choke and the integrator circuit are preferably kept as constant as possible over temperature in order to keep the gain factor of the device for measuring the current through a choke, i.e. the sensor circuit, constant over the frequency range. If this were not the case, the device for measuring the current through a choke could generate a measurement error during rapid current changes or, conversely, in the case of short-circuit monitoring, measure the current too slowly. Since the NTC resistor in this circuit is no longer connected to the output of the integrator circuit, the first and second filter capacitors are used to adjust the gain factor frequency-selectively so that it remains constant both over temperature and over the frequency range. The first filter capacitor short-circuits the NTC resistor at higher frequencies so that it is no longer active above a specific cutoff frequency, or no longer contributes to the overall gain. With the second filter capacitor, the effect of the first voltage divider resistor is switched off for higher frequencies, so that only the second voltage divider resistor now contributes to the overall gain. This allows the amplifier to be set such that the NTC resistor acts frequency-selectively only in a specific frequency range, preferably towards the low frequencies, preferably only at low frequencies below a specified or specifiable cutoff frequency, preferably the cutoff frequency of the choke, which is given by the quotient of its inductance and copper resistance.

Therefore, the zero-point offset generation is decoupled from the NTC resistor and a bidirectional current measurement is thus possible. The first, second and third offset voltages are not adversely affected by the temperature and a constant overall transfer function is also maintained over the frequency range.

The present invention also relates to a voltage converter having an above-described device. For this purpose the voltage converter is designed as an inverter, as a DC converter, or as a charging device.

A special voltage converter with a device for measuring a current through a choke is advantageously provided.

The invention also relates to a drive train of a vehicle with a voltage converter. For example, such a drive train with a voltage converter and an above-described device is used to power an electric vehicle. The device provides an efficient means of measuring a current through a choke.

The invention also relates to a vehicle having an above-described drive train. This means that a vehicle is provided which comprises a device that can be used to efficiently measure a current through a choke.

Furthermore, the invention relates to a method for operating a device having the following steps: determining the current through a choke of a voltage converter and controlling the voltage converter as a function of the determined current.

A method for efficiently measuring a current through a choke is advantageously provided.

Furthermore, the invention relates to a computer program comprising commands which, when executed by a computer, cause the computer to perform the steps of the previously described method.

Furthermore, the invention relates to a computer-readable storage medium, comprising commands which, when executed by a computer, cause the computer to carry out the steps of the previously described method.

It is understood that the features, characteristics and advantages of the device are relevant to or applicable to the method or the powertrain and the vehicle, and vice versa.

Other features and advantages of embodiments of the invention are derived from the following description and with reference to the accompanying drawings.

BRIEF DESCRIPTION OF THE DRAWINGS

In the following the invention will be explained in further detail by reference to several drawings, in which.

DETAILED DESCRIPTION

Figure 1:
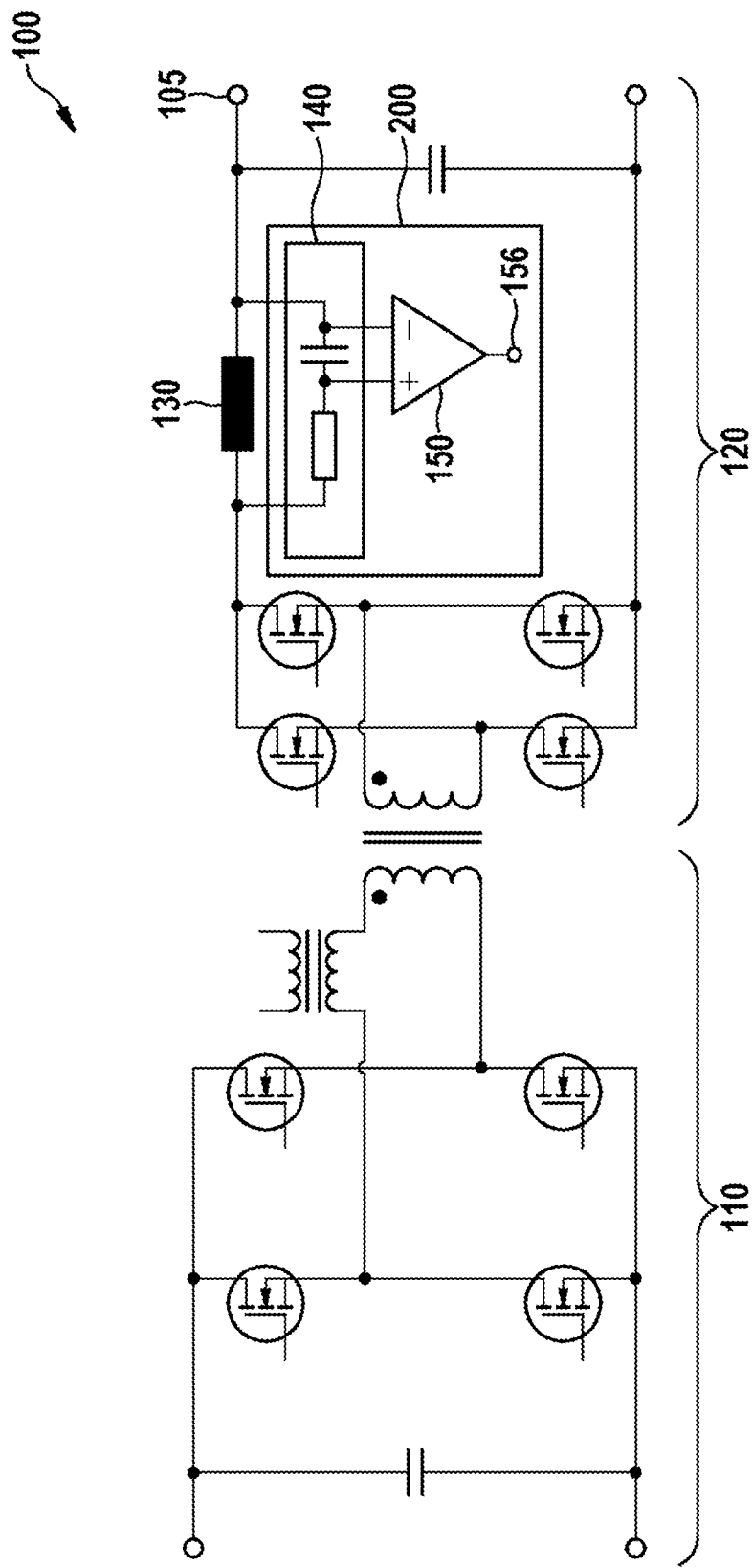
FIG. 1 shows a schematic illustration of a voltage converter with a choke.

FIG. 1 shows a schematic illustration of a voltage converter 100 with a choke 130. The voltage converter 100 is preferably designed as an inverter, a DC converter, or a charging device. FIG. 1 shows it in exemplary form as a DC voltage converter. This comprises a primary circuit 110 and a secondary circuit 120, which are galvanically isolated from each other by means of a transformer. The secondary circuit 120 comprises a choke 130 at the output, preferably a smoothing choke, which is connected to the output terminal 105 of the voltage converter 100 on the output side of the voltage converter 100. While the voltage converter 100 is operating, a current, or the load current, of the voltage converter 100 flows through this choke 130 when electrical energy is transported from the primary circuit 110 to the secondary circuit 120 or in the reverse direction. FIG. 1 also shows a device 200 for measuring a current through the choke 130 of the voltage converter 100. The device comprises an integrator circuit 140 connected in parallel with the choke 130. The device 200 also comprises an amplifier circuit. The integrator output signal of the integrator circuit 140 is post-processed by means of an amplifier circuit, or by means of the illustrated operational amplifier 150. A voltage signal characterizing the current through the choke 130 is present at the amplifier output terminal 156 of the amplifier circuit.

Figure 2:
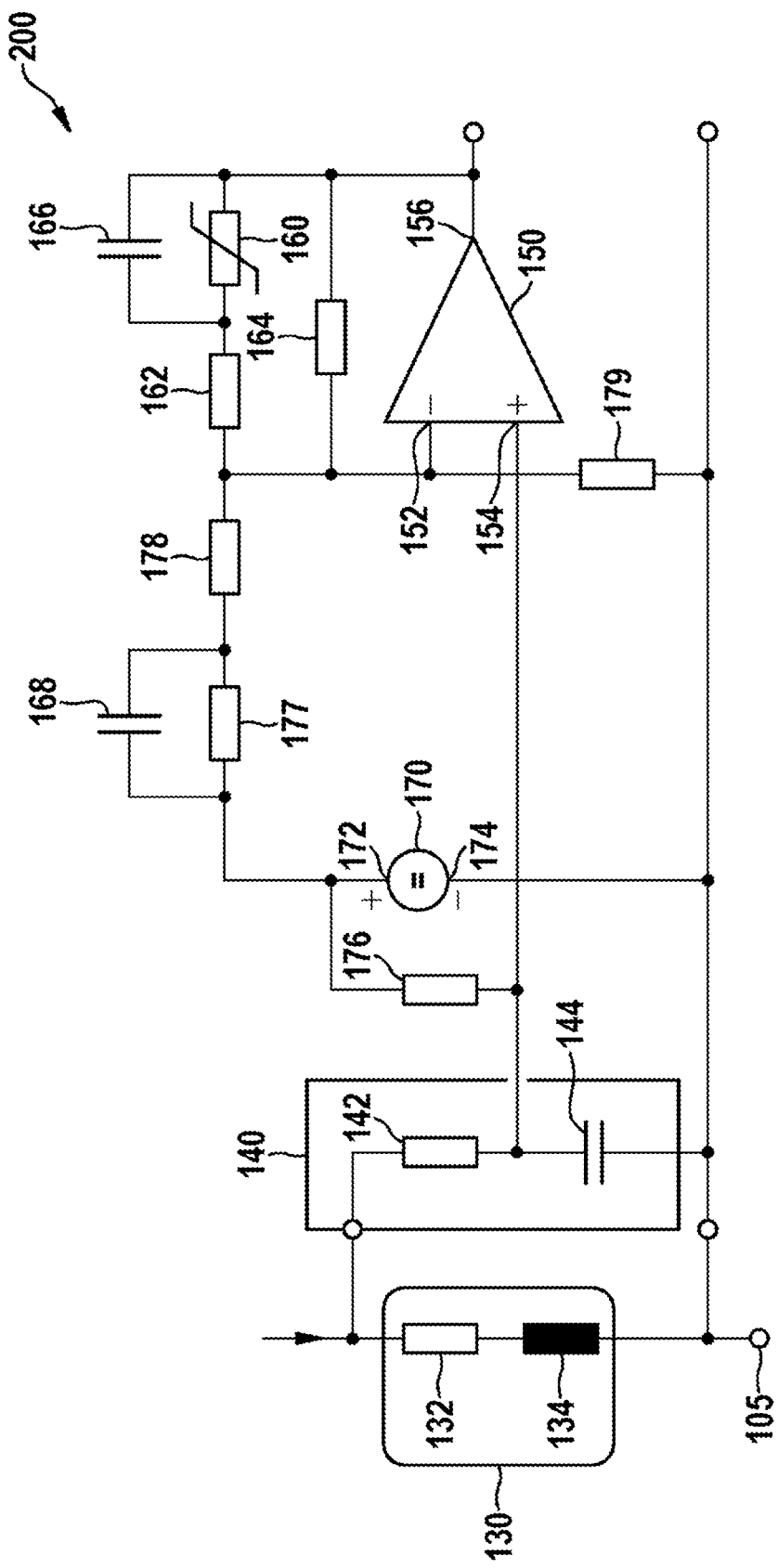
FIG. 2 shows a schematic representation of a device for measuring a current through a choke of a voltage converter.

FIG. 2 shows a device 200 for measuring a current through a choke 130 of a voltage converter 100. FIG. 1 shows the output terminal 105 of the voltage converter 100 and the choke 130 connected to it, which are represented in an equivalent circuit diagram as an ohmic DC choke resistance 132 and an inductance 134 of the choke 130. The device comprises the integrator circuit 140 connected in parallel with the choke 130. In addition, the device 200 comprises an amplifier circuit and an NTC resistor 160. A load current of the voltage converter 100 flows through the choke 130. The integrator circuit 140 comprises a series circuit consisting of an integrator resistor 142 and an integrator capacitor 144. The integrator capacitor 144 is also connected to the output terminal 105 of the voltage converter 100. A center tap is implemented between the integrator resistor 142 and the integrator capacitor 144 as the output of the integrator circuit 140. An integrator output signal is present at this output of the integrator circuit 140. The amplifier circuit comprises an inverting and a non-inverting amplifier input terminal 152, 154 and an amplifier output terminal 156. The non-inverting amplifier input terminal 154 is supplied with an amplifier input signal as a function of the integrator output signal. A voltage signal characterizing the current through the choke 130 is present at the amplifier output terminal 156 of the amplifier circuit. The NTC resistor 160 is arranged in the feedback path of the amplifier circuit between the inverting amplifier input terminal 152 and the amplifier output terminal 156. Preferably, the amplifier circuit comprises an operational amplifier 150, which preferably operates as a non-inverting operational amplifier. Preferably, the device 200 comprises a reference voltage source 170 with a positive source terminal 172 and a negative source terminal 174. Using the reference voltage source 170, a first offset voltage is coupled in at the output of the integrator circuit 140. The negative source terminal 174 is preferably connected to the output terminal 105 of the voltage converter 100. The positive source terminal 172 is preferably connected to the output of the integrator circuit 140 via a coupling resistor 176. It is also preferable if, using the reference voltage source 170, a second offset voltage is coupled into the feedback path at the inverting amplifier input terminal 152 of the amplifier circuit. The positive source terminal 172 is preferably connected to the output terminal 105 of the voltage converter 100 via a voltage divider consisting of a first, second and third voltage divider resistor 177, 178, 179. Preferably, a tap between the second and third voltage divider resistors 178, 179 is connected to the inverting amplifier input terminal 152. Preferably, in the feedback path of the amplifier circuit between the inverting amplifier input terminal 152 and the amplifier output terminal 156, a series resistor 162 is arranged in series with the NTC resistor 160 and a parallel resistor 164 is arranged in parallel with the series circuit consisting of series resistor 162 and NTC resistor 160. It is also preferable to arrange a first filter capacitor 166 in parallel with the NTC resistor 160 and/or a second filter capacitor 168 in parallel with the first voltage divider resistor 177.

A possible supply concept for the device is as follows: according to FIG. 2, the reference potential of the amplifier circuit or the operational amplifier 150 lies at the voltage after the choke at the output terminal 105, preferably at the output of a switching power supply or a DC voltage converter. To supply the amplifier circuit a supply voltage which is greater than the voltage at the output terminal 105 is preferably required. It would be preferable to use a charge pump or to generate a so-called high-side auxiliary voltage. The voltage signal at the amplifier output terminal 156 is preferably transferred to the ground potential by means of a further circuit, for example by means of a high-side measuring amplifier or a current mirror.

Alternatively, the integrator output signal is preferably transferred via a differential amplifier or a bidirectional high-side current measuring amplifier to the ground reference potential of the voltage converter in order to process it further, preferably to feed it to the non-inverting amplifier input terminal 154 as an amplifier input signal as a function of the integrator output signal. The reference potential for the reference voltage source and the amplifier circuit is the ground reference potential of the voltage converter.

Figure 3:
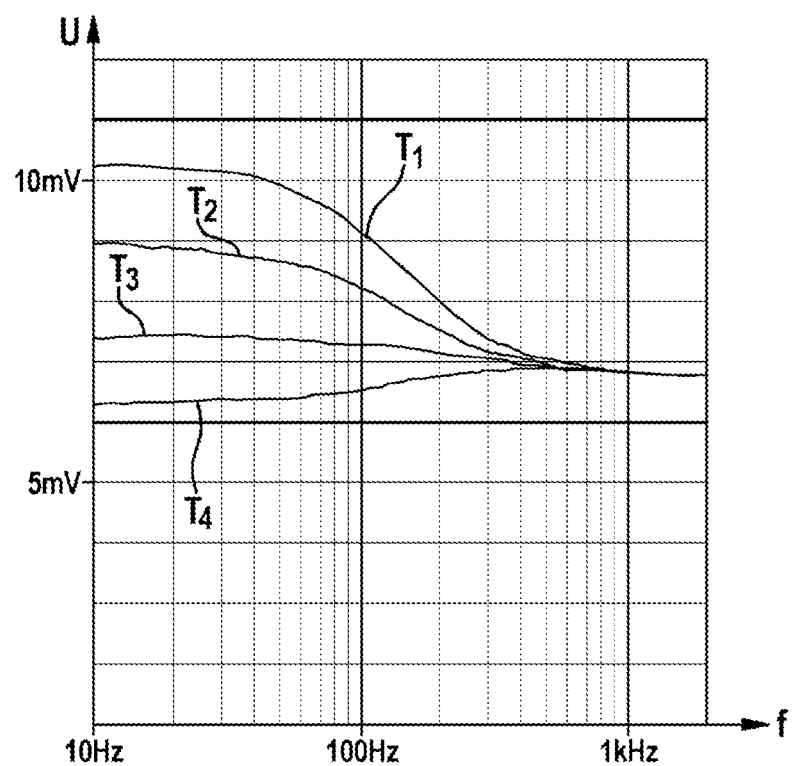
FIG. 3 shows a schematic diagram showing the uncompensated characteristic of the overall transfer function against frequency at different temperatures.

FIG. 3 shows a schematic diagram showing the uncompensated characteristic of the overall transfer function in mV (per A) against frequency at different temperatures (T1, T2, T3, T4). For low frequencies, a broad spreading of the overall transfer function can be observed at different temperatures (T1, T2, T3, T4).

Figure 4:
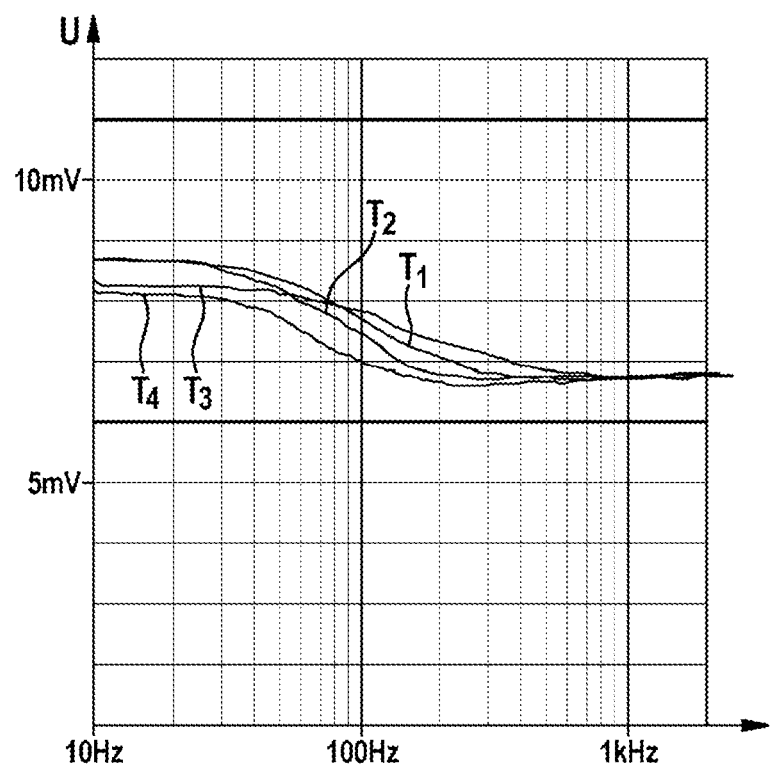
FIG. 4 shows a schematic diagram showing the compensated characteristic of the overall transfer function against frequency at different temperatures.

FIG. 4 shows a schematic diagram showing the characteristic of the total transfer function in mV (per A) against frequency at different temperatures (T1, T2, T3, T4), compensated by means of the series resistor 162 in series with the NTC resistor 160 and by the parallel resistor 164 in parallel with the series circuit consisting of the series resistor 162 and NTC resistor 160 in the feedback path. Compared to FIG. 3, the spread of the overall transfer function for low frequencies at different temperatures is significantly reduced.

Figure 5:
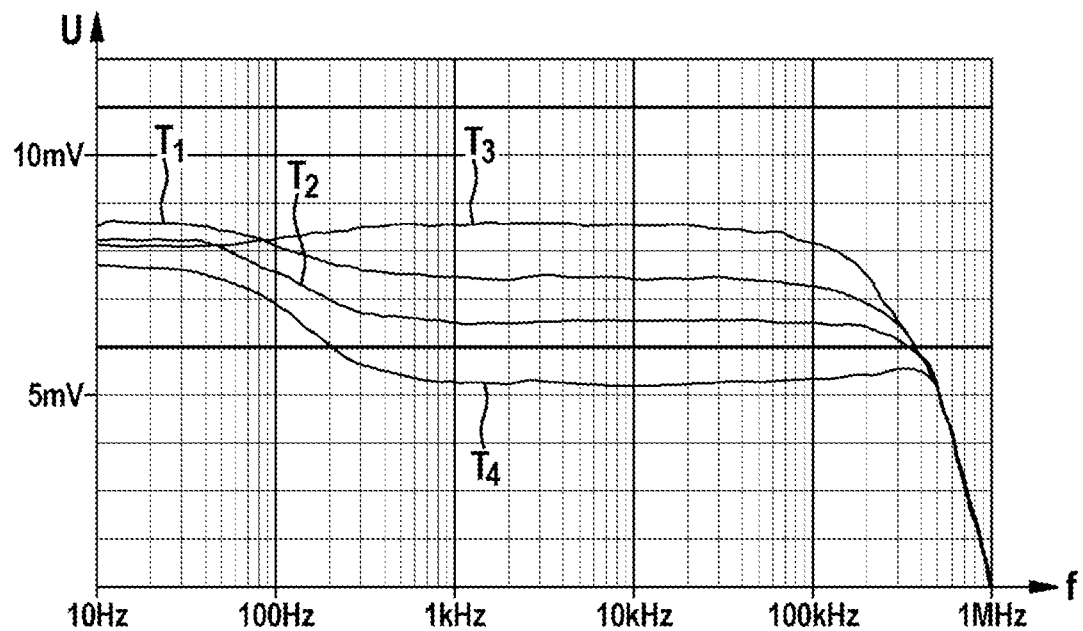
FIG. 5 shows a schematic diagram showing the uncompensated characteristic of the overall transfer function against frequency at different temperatures without filter capacitors.

FIG. 5 shows a schematic diagram showing the uncompensated characteristic of the overall transfer function in mV (per A) against frequency at different temperatures (T1, T2, T3, T4) without filter capacitors. Over a wide frequency range, a broad spreading or dispersion of the overall transfer function can be observed at different temperatures (T1, T2, T3, T4).

Figure 6:
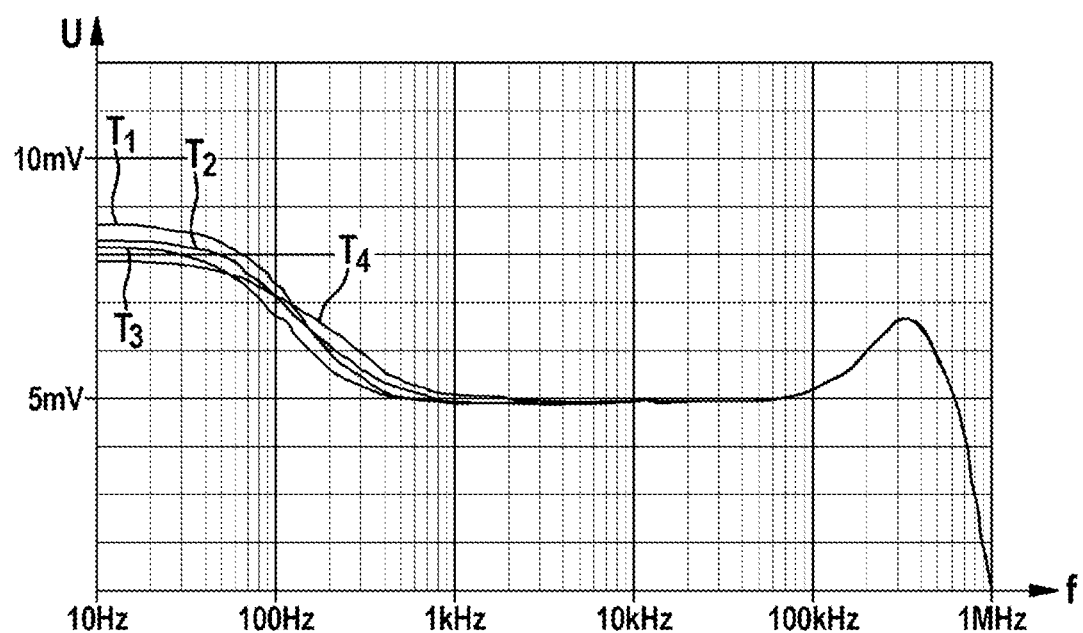
FIG. 6 shows a schematic diagram showing the partially compensated characteristic of the overall transfer function against frequency at different temperatures with the first filter capacitor.

FIG. 6 shows a schematic diagram showing the characteristic of the overall transfer function in mV (per A) against frequency at different temperatures (T1, T2, T3, T4), partially compensated by means of the first filter capacitor. Compared to FIG. 5, the dispersion of the overall transfer function at different temperatures (T1, T2, T3, T4) is significantly reduced over a wide frequency range. By means of the first filter capacitor, the effect of the NTC resistor is cancelled out above a specific frequency.

Figure 7:
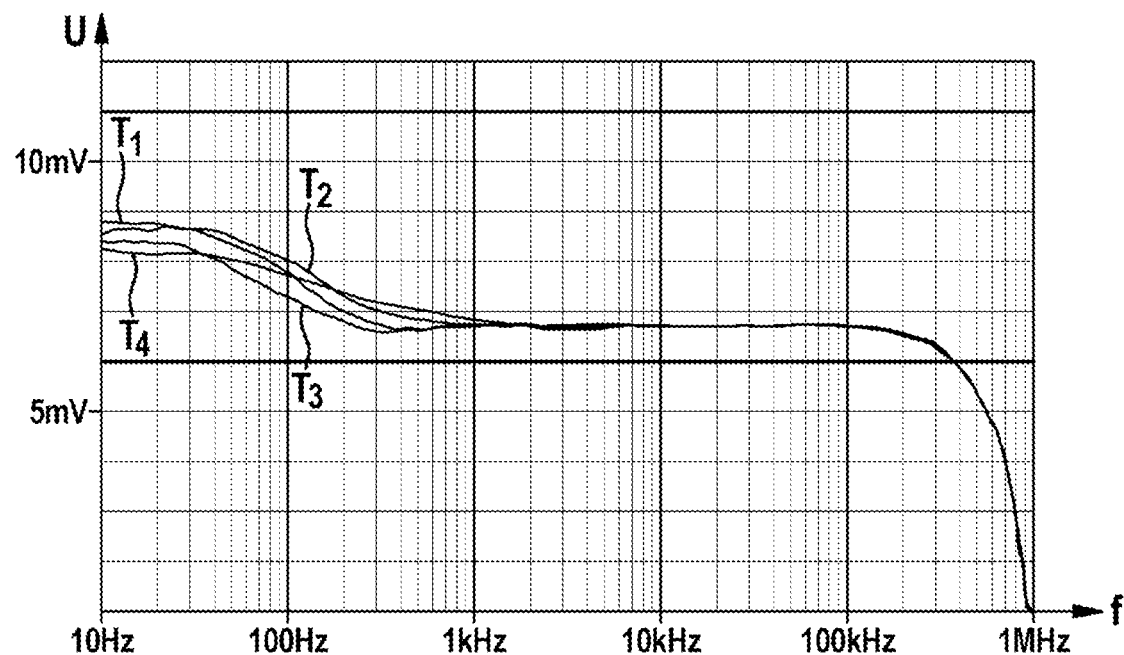
FIG. 7 shows a schematic diagram showing the compensated characteristic of the overall transfer function against frequency at different temperatures with the first and the second filter capacitor.

FIG. 7 shows a schematic diagram showing the characteristic of the overall transfer function in mV (per A) against frequency at different temperatures (T1, T2, T3, T4), compensated by means of the first and second filter capacitors. Compared to FIG. 6, an increase in a plateau of the overall transfer function over a wide frequency range can be observed at different temperatures (T1, T2, T3, T4). By dimensioning the second filter capacitor, the gain at higher frequencies can be specified.

Figure 8:
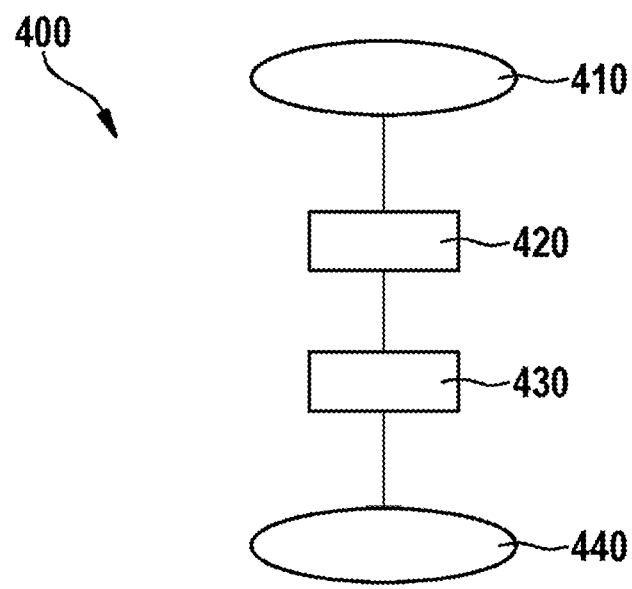
FIG. 8 shows a schematically illustrated method for operating the device.

FIG. 8 shows a schematically illustrated method 400 for operating the device 200. In step 410 the method 400 starts. In step 420, the current through a choke 130 of a voltage converter 100 is determined. In step 430, the voltage converter 100 is activated as a function of the determined current. The method ends at step 440.

Figure 9:
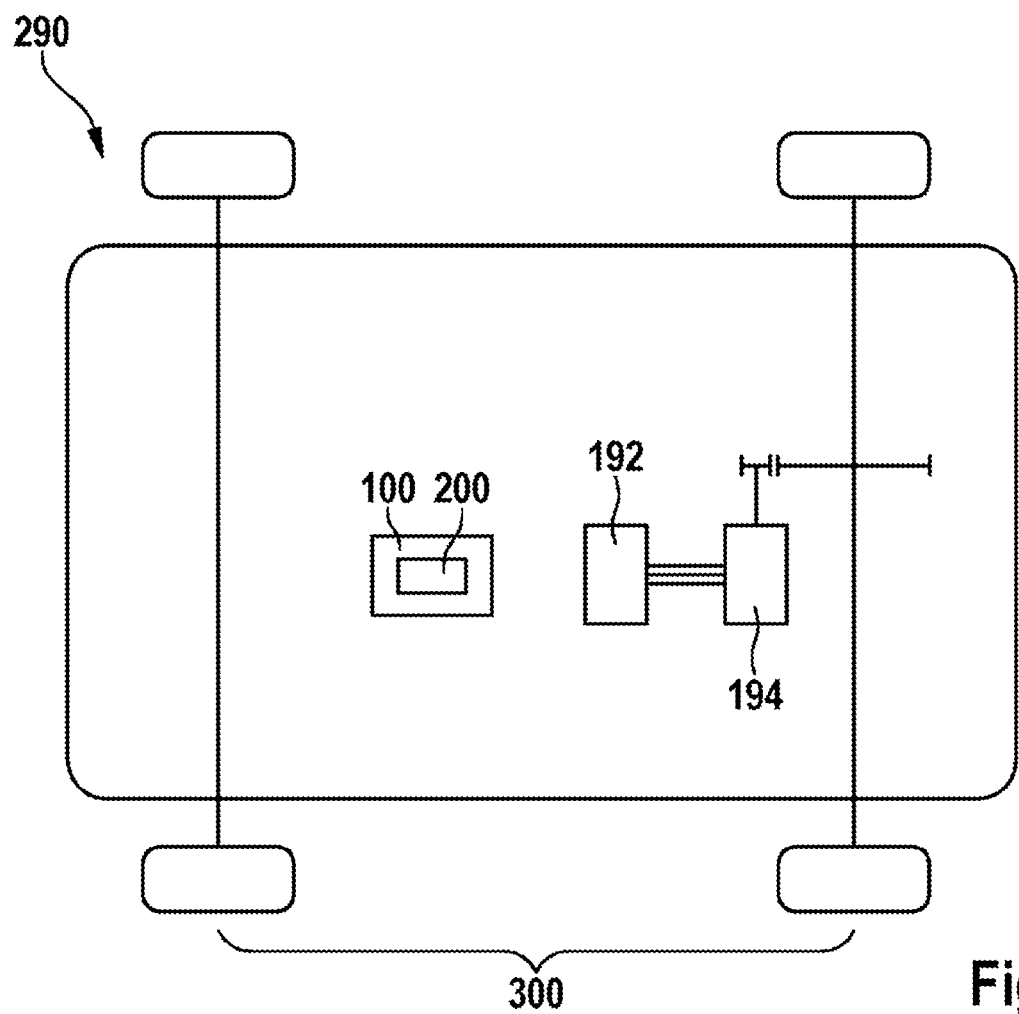
FIG. 9 shows a schematically illustrated vehicle with a drive train and a voltage converter.

FIG. 9 shows a schematically illustrated vehicle 290 with a drive train 300 and a voltage converter 100. The voltage converter comprises the device 200 as described in relation to FIG. 2. Preferably, the electric drive train comprises a battery (not shown) to supply the drive train, which also preferably comprises an inverter 192 and/or an electric motor 194.

The invention claimed is:
1. A device (200) for measuring a current through a choke (130) of a voltage converter (100), the device comprising:
an integrator circuit (140), an amplifier circuit, and an NTC resistor (160),
wherein a load current of the voltage converter (100) flows through the choke (130) and the choke (130) is connected on the output side to an output terminal (105) of the voltage converter (100), wherein the integrator circuit (140) is arranged in parallel with the choke (130) and comprises a series circuit having an integrator resistor (142) and an integrator capacitor (144), wherein the integrator capacitor (144) is also connected to the output terminal (105) of the voltage converter (100) and a center tap is formed between the integrator resistor (142) and the integrator capacitor (144) as the output of the integrator circuit (140) and an integrator output signal is present at the output of the integrator circuit (140), wherein the amplifier circuit comprises an inverting and a non-inverting amplifier input terminal (152, 154) and an amplifier output terminal (156), and the non-inverting amplifier input terminal (154) is supplied with an amplifier input signal depending on the integrator output signal, and a voltage signal characterizing the current through the choke (130) is present at the amplifier output terminal (156) of the amplifier circuit, wherein the NTC resistor (160) is arranged in the feedback path of the amplifier circuit between the inverting amplifier input terminal (152) and the amplifier output terminal (156).

2. The device (200) as claimed in claim 1, wherein the amplifier circuit comprises an operational amplifier (150), which operates as a non-inverting operational amplifier.

3. The device (200) as claimed in claim 1, having a reference voltage source (170) with a positive source terminal (172) and a negative source terminal (174), wherein a first offset voltage is coupled in at the output of the integrator circuit (140) by means of the reference voltage source (170), wherein the negative source terminal (174) is connected to the output terminal (105) of the voltage converter (100), and the positive source terminal (172) is connected to the output of the integrator circuit (140) via a coupling resistor (176).

4. The device (200) as claimed in claim 3, wherein by means of the reference voltage source (170), a second offset voltage is coupled into the feedback path at the inverting amplifier input terminal (152) of the amplifier circuit, wherein the negative source terminal (174) is connected to the output terminal (105) of the voltage converter (100), and the positive source terminal (172) is connected to the output terminal (105) of the voltage converter (100) via a voltage divider consisting of a first, second and third voltage divider resistor (177, 178, 179), and a tap between the second and third voltage divider resistors (178, 179) is connected to the inverting amplifier input terminal (152).

5. The device (200) as claimed in claim 1, wherein in the feedback path of the amplifier circuit, between the inverting amplifier input terminal (152) and the amplifier output terminal (156), a series resistor (162) is arranged in series with the NTC resistor (160) and a parallel resistor (164) is arranged in parallel with the series circuit consisting of series resistor (162) and NTC resistor (160).

6. The device (200) as claimed in claim 1, wherein a first filter capacitor (166) is arranged in parallel with the NTC resistor (160).

7. The device (200) as claimed in claim 4, wherein a second filter capacitor (168) is arranged in parallel with the first voltage divider resistor (177) or the second voltage divider resistor (178).

8. A voltage converter (100) having a device (200) as claimed in claim 1, wherein the voltage converter is designed as an inverter, a DC converter or as a charging device.

9. A drive train (300) of a vehicle (290) having a voltage converter (100) as claimed in claim 8.

10. A vehicle (290) having a drive train (300) as claimed in claim 9.

11. A method (400) for operating a device (200) comprising an integrator circuit (140), an amplifier circuit, and an NTC resistor (160), wherein a load current of the voltage converter (100) flows through the choke (130) and the choke (130) is connected on the output side to an output terminal (105) of the voltage converter (100), wherein the integrator circuit (140) is arranged in parallel with the choke (130) and comprises a series circuit having an integrator resistor (142) and an integrator capacitor (144), wherein the integrator capacitor (144) is also connected to the output terminal (105) of the voltage converter (100) and a center tap is formed between the integrator resistor (142) and the integrator capacitor (144) as the output of the integrator circuit (140) and an integrator output signal is present at the output of the integrator circuit (140), wherein the amplifier circuit comprises an inverting and a non-inverting amplifier input terminal (152, 154) and an amplifier output terminal (156), and the non-inverting amplifier input terminal (154) is supplied with an amplifier input signal depending on the integrator output signal, and a voltage signal characterizing the current through the choke (130) is present at the amplifier output terminal (156) of the amplifier circuit, wherein the NTC resistor (160) is arranged in the feedback path of the amplifier circuit between the inverting amplifier input terminal (152) and the amplifier output terminal (156), method comprising steps of:

determining (420) the current through a choke (130) of a voltage converter (100), and controlling (430) the voltage converter (100) as a function of the determined current.

12. A non-transitory, computer-readable medium comprising instructions that when executed by a computer cause said computer to control an integrator circuit (140), an amplifier circuit, and an NTC resistor (160), wherein a load current of the voltage converter (100) flows through the choke (130) and the choke (130) is connected on the output side to an output terminal (105) of the voltage converter (100), wherein the integrator circuit (140) is arranged in parallel with the choke (130) and comprises a series circuit having an integrator resistor (142) and an integrator capacitor (144), wherein the integrator capacitor (144) is also connected to the output terminal (105) of the voltage converter (100) and a center tap is formed between the integrator resistor (142) and the integrator capacitor (144) as the output of the integrator circuit (140) and an integrator output signal is present at the output of the integrator circuit (140), wherein the amplifier circuit comprises an inverting and a non-inverting amplifier input terminal (152, 154) and an amplifier output terminal (156), and the non-inverting amplifier input terminal (154) is supplied with an amplifier input signal depending on the integrator output signal, and a voltage signal characterizing the current through the choke (130) is present at the amplifier output terminal (156) of the amplifier circuit, wherein the NTC resistor (160) is arranged in the feedback path of the amplifier circuit between the inverting amplifier input terminal (152) and the amplifier output terminal (156), by:

determining (420) the current through a choke (130) of a voltage converter (100), and controlling (430) the voltage converter (100) as a function of the determined current.

\* \* \* \* \*